United States Patent
Fujii

(10) Patent No.: US 9,998,113 B2
(45) Date of Patent: Jun. 12, 2018

(54) CONTROL DEVICE FOR CONTROLLING SWITCHING POWER SUPPLY

(71) Applicant: FUJI ELECTRIC CO., LTD., Kawasaki-shi, Kanagawa (JP)

(72) Inventor: Masanari Fujii, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 224 days.

(21) Appl. No.: 15/176,245

(22) Filed: Jun. 8, 2016

(65) Prior Publication Data

US 2017/0033788 A1    Feb. 2, 2017

(30) Foreign Application Priority Data

Jul. 31, 2015    (JP) .................. 2015-151797

(51) Int. Cl.
| | |
|---|---|
| H03K 17/00 | (2006.01) |
| H03K 17/22 | (2006.01) |
| H03K 5/24 | (2006.01) |
| H02M 1/32 | (2007.01) |
| H02M 3/156 | (2006.01) |

(52) U.S. Cl.
CPC ............ *H03K 17/223* (2013.01); *H02M 1/32* (2013.01); *H02M 3/156* (2013.01); *H03K 5/24* (2013.01)

(58) Field of Classification Search
None
See application file for complete search history.

(56) References Cited

U.S. PATENT DOCUMENTS

| 9,665,744 | B2 * | 5/2017 | Hiasa ..................... G06G 7/14 |
| 2009/0141523 | A1 * | 6/2009 | Sugawara ........... H02M 1/4225 363/89 |
| 2009/0174978 | A1 * | 7/2009 | Nakamura ........... H02H 7/1213 361/90 |
| 2009/0268488 | A1 * | 10/2009 | Fujii ...................... H02M 1/32 363/49 |
| 2010/0061129 | A1 * | 3/2010 | Fujii ...................... H02M 1/10 363/127 |
| 2012/0223768 | A1 | 9/2012 | Higuchi |
| 2016/0190936 | A1 * | 6/2016 | Ke .................... H02M 3/33507 363/21.12 |

FOREIGN PATENT DOCUMENTS

JP    2012-182622 A    9/2012

* cited by examiner

*Primary Examiner* — Tuan T Lam
(74) *Attorney, Agent, or Firm* — Rabin & Berdo, P.C.

(57) ABSTRACT

A voltage dividing circuit includes a first register that is supplied with an input voltage and a second resistor, and divides the input voltage to generate a divided voltage. A detection circuit compares the divided voltage with a brown-in detection threshold value, and outputs a first detection signal of H level when the divided voltage is equal to or higher than the threshold value, and outputs the first detection signal of L level when the divided voltage is lower than the threshold value. A brown-in timer outputs a second detection signal after a first predetermined time has elapsed since the time point of the first detection signal. A latch circuit latches an output from the detection circuit in response to the second detection signal. A logical element at least performs logical AND operation of an output of the latch circuit and a PWM signal.

14 Claims, 10 Drawing Sheets

| MODEL | CR TIME CONSTANT (ms) | SURGING TIME ($\mu$s) | FIRST PREDETERMINED TIME ($\mu$s) |
|---|---|---|---|
| MODEL 1 | 1.4 | 30 | 200 |
| MODEL 2 | 0.5 | 14 | 71 |
| MODEL 3 | 5.2 | 140 | 740 |
| MODEL 4 | 3.5 | 90 | 500 |

CONTROL DEVICE FOR CONTROLLING SWITCHING POWER SUPPLY

CROSS-REFERENCE TO RELATED APPLICATION

This application is based upon and claims the benefit of priority of the prior Japanese Patent Application No. 2015-151797, filed on Jul. 31, 2015, the entire contents of which are incorporated herein by reference.

BACKGROUND OF THE INVENTION

1. Field of the Invention

The present technology relates to a control device for controlling a switching power supply.

2. Background of the Related Art

A control integrated circuit (IC) for controlling a switching power supply has a brown-in/out detection function to control operation of the switching power supply in a stable manner.

A brown-out refers to a state in which an input voltage of a switching power supply drops too much to maintain normal operation of the switching power supply. When a brown-out occurs, the switching operation stops, and a load is not driven normally. Hence, a control IC detects a brown-out before its function stops.

Also, a brown-in refers to a state in which an input voltage rises from a low voltage to a predetermined voltage (brown-out reset). In this case, if erroneous brown-in operation occurs to restart switching operation before the input voltage reaches a sufficient voltage, the switching operation becomes unstable. Hence, in the control IC, it is important to accurately detect an input voltage that has reached a predetermined voltage (brown-in voltage) from a low voltage state.

For example, a switching operation stabilizing technology proposed in the past generates, from a pulse control signal, a mask signal for preventing reception of a digital signal within a generation period of power supply noise due to switching operation, in order to reduce erroneous switching operation (see Japanese Laid-open Patent Publication No. 2012-182622).

A brown-in/out detection resistor for detecting brown-in and brown-out is always connected to a terminal to which an input voltage is applied, thereby causing electric power loss. Therefore, the brown-in/out detection resistor has a high resistance in order to reduce the electric power loss at that part.

Also, to reduce the chip size of a control IC, a brown-in/out detection resistor is provided at the vicinity of circuit elements around the brown-in/out detection resistor. Because of this layout of the control IC, capacitive coupling is generated between the brown-in/out detection resistor and the circuit elements around the brown-in/out detection resistor, and a voltage detected by the brown-in/out detection resistor is likely to fluctuate, due to the influence of this stray capacitance.

Hence, in the past, a brown-in voltage was unable to be detected highly accurately, and it has been difficult to prevent erroneous brown-in operation unfailingly.

SUMMARY OF THE INVENTION

According to one aspect, there is provided a control device for controlling a switching power supply. The control device includes: a voltage dividing circuit configured to generate a divided voltage by dividing an input voltage, the voltage dividing circuit including a first resistor which is supplied with the input voltage at one end thereof and a second resistor whose one end is connected to another end of the first resistor; a detection circuit configured to compare the divided voltage with a brown-in detection threshold value to determine whether the divided voltage reaches a brown-in voltage, and output a first detection signal of high electric potential level during a period in which the divided voltage is equal to or higher than the brown-in detection threshold value, and output the first detection signal of low electric potential level during a period in which the divided voltage is lower than the brown-in detection threshold value; a brown-in timer configured to output a second detection signal after a first predetermined time elapses after reception of the first detection signal; a latch circuit configured to latch an output from the detection circuit in response to the second detection signal; and a logical element configured to at least perform a logical AND operation of an output of the latch circuit and a pulse width modulation signal for controlling a switching element of the switching power supply.

The object and advantages of the invention will be realized and attained by means of the elements and combinations particularly pointed out in the claims.

It is to be understood that both the foregoing general description and the following detailed description are provided by way of example and explanatory and are not restrictive of the invention.

BRIEF DESCRIPTION OF DRAWINGS

FIG. 10 illustrates first predetermined times set in a brown-in timer.

DETAILED DESCRIPTION OF THE INVENTION

Figure 1A:
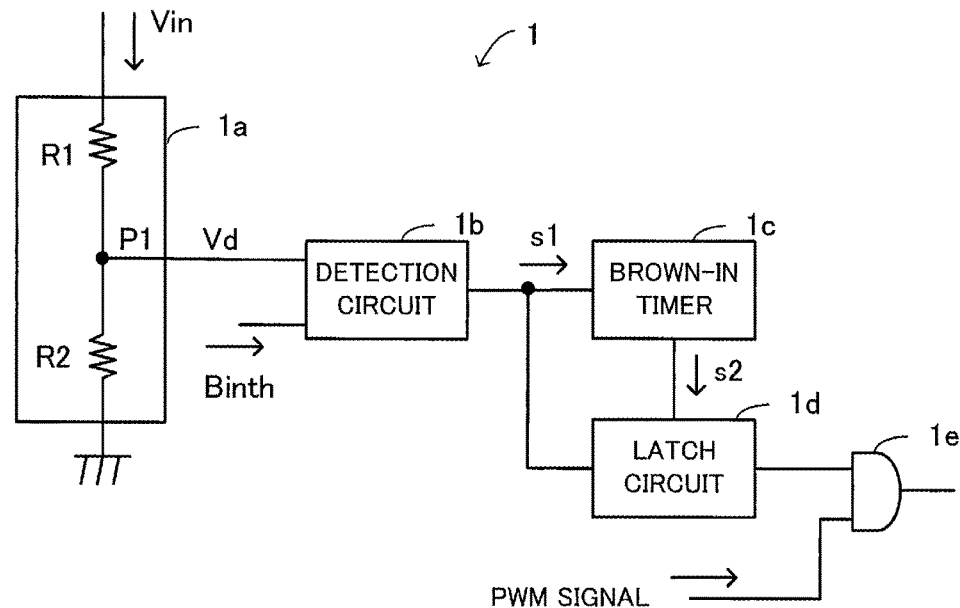
FIG. 1A illustrates an example of a configuration of a control device for controlling a switching power supply.

Several embodiments will be described below with reference to the accompanying drawings, wherein like reference numerals refer to like elements throughout.

FIG. 1A illustrates an example of a configuration of a control device for controlling a switching power supply. The control device 1 includes a voltage dividing circuit 1a, a detection circuit 1b, a brown-in timer 1c, a latch circuit 1d, and a logical element 1e.

The voltage dividing circuit 1a generates a divided voltage Vd at a voltage dividing point P1, by dividing an input voltage Vin by means of a resistor R1 (a first resistor) to which the input voltage Vin is applied at one end and a resistor R2 (a second resistor) whose one end is connected to another end of the resistor R1.

The detection circuit 1b compares the divided voltage Vd with a brown-in detection threshold value Binth to determine whether or not the divided voltage Vd reaches a brown-in voltage.

Then, the detection circuit 1b outputs a detection signal s1 (a first detection signal) of a high electric potential level (H level) during a period in which the divided voltage Vd is equal to or higher than the brown-in detection threshold value Binth. Also, the detection circuit 1b outputs a low electric potential level (L level) during a period in which the divided voltage Vd is lower than the brown-in detection threshold value Binth.

The brown-in timer 1c starts timer operation, triggered by the detection signal s1, and outputs a detection signal s2 (a second detection signal) after a first predetermined time elapses. The latch circuit 1d latches the output from the detection circuit 1b in response to the detection signal s2.

The logical element 1e performs logical AND operation of an output of the latch circuit 1d and a pulse width modulation signal (PWM signal) for controlling a switching element of the switching power supply, at least. Note that the logical element 1e may receive three or more inputs to perform logical AND operation of the output of the latch circuit 1d, the PWM signal, and other conditional signals.

Figure 1B:
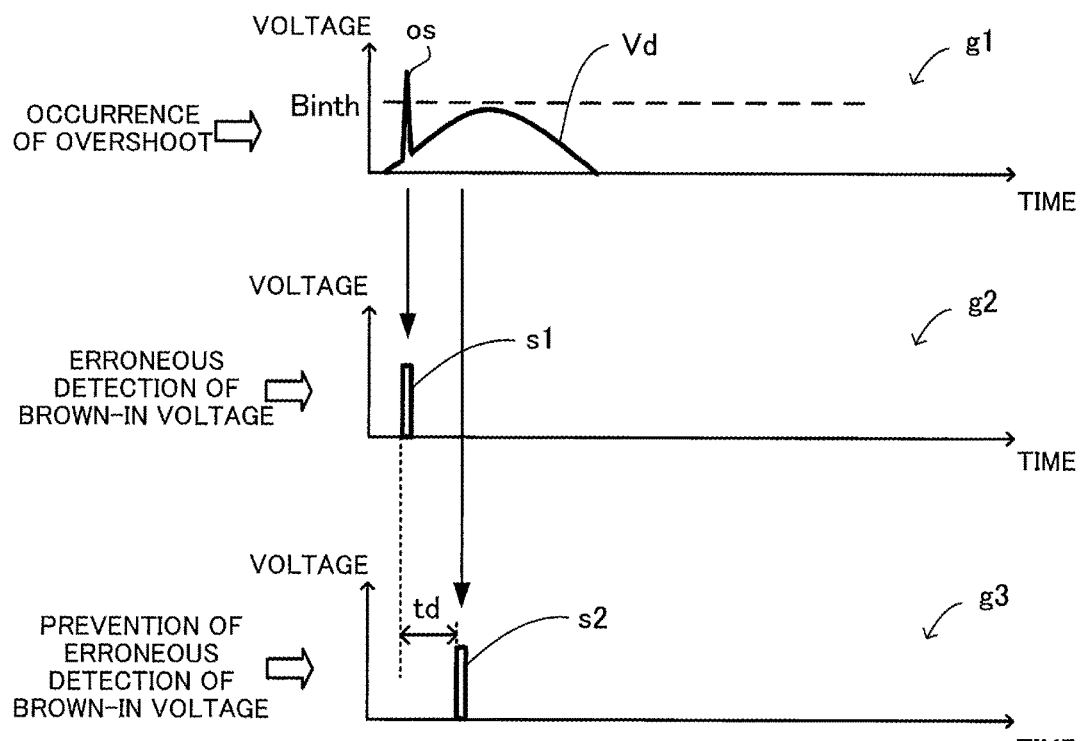
FIG. 1B illustrates operation for preventing erroneous detection of a brown-in voltage.

FIG. 1B illustrates operation for preventing erroneous detection of a brown-in voltage. The vertical axis represents voltage, and the horizontal axis represents time. A waveform g1 is a divided voltage Vd. Also, in the illustrated situation, an overshoot over the divided voltage Vd os occurs within a voltage fluctuation period of the voltage dividing point P1.

The overshoot os exceeds the brown-in detection threshold value Binth, and therefore the detection circuit 1b outputs the detection signal s1 as illustrated in a waveform g2.

When the brown-in timer 1c detects that a first predetermined time td has elapsed from the detection signal s1, the brown-in timer 1c outputs the detection signal s2 as illustrated in a waveform g3.

Here, the detection signal s1 is created by detecting the overshoot os generated during the voltage fluctuation period of the voltage dividing point P1, and is not created by detecting the divided voltage Vd that has reached the brown-in voltage.

Thus, the control device 1 of the present technology prevents erroneous brown-in voltage detection during the voltage fluctuation period, by latching the output of the detection circuit 1b in response to the detection signal s2 output after the first predetermined time has elapsed from the detection signal s1. Thereby, a brown-in voltage is detected highly accurately, in order to prevent erroneous brown-in operation.

Figure 2:
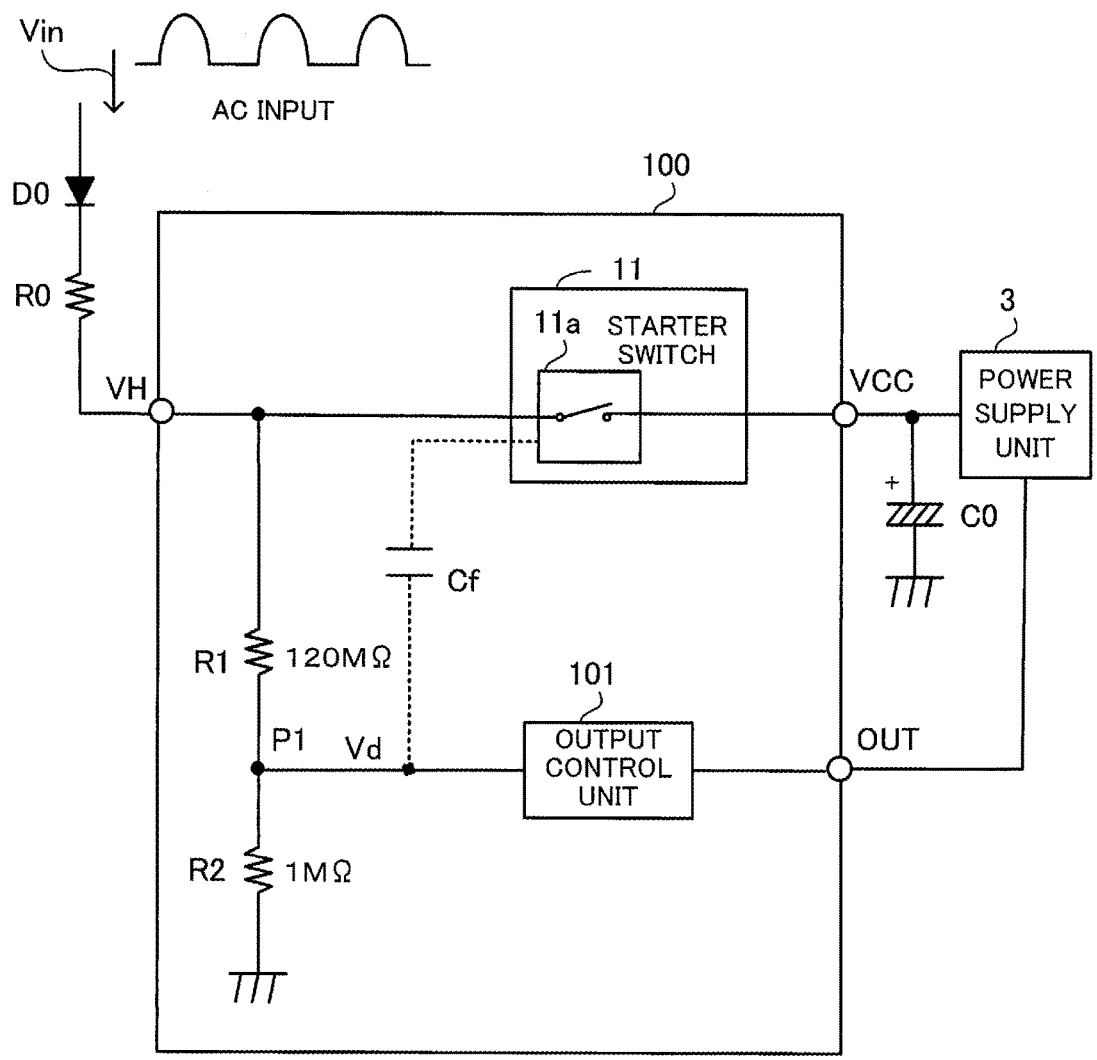
FIG. 2 is a diagram for describing a factor that causes voltage fluctuation at a voltage dividing point of an input voltage.

Next, problems that are to be solved will be described, before the detail of the technology of the present technology is described. FIG. 2 is a diagram for describing a factor that causes voltage fluctuation at the voltage dividing point of the input voltage. The control IC 100 controls switching of a power supply unit 3.

Resistors R1 and R2, a starter circuit 11, and an output control unit 101 are located inside the control IC 100. Also, a diode D0 and a resistor R0 are located outside an input terminal VH.

A half-wave rectified alternate current (AC) voltage (which may be a full-wave rectified AC voltage or a direct current DC voltage instead) is applied to an anode of the diode D0 as an input voltage Vin.

A cathode of the diode D0 is connected to one end of the resistor R0, and another end of the resistor R0 is connected to the terminal VH of the control IC 100. Note that the resistor R0 is a current limiting resistor to limit an electrical current that enters the control IC 100.

Also, the terminal VH is connected to an input terminal of the starter circuit 11 and one end of the resistor R1, and the other end of the resistor R1 is connected to one end of the resistor R2 and an input terminal of the output control unit 101, and the other end of the resistor R2 is connected to a ground (GND).

An output terminal of the starter circuit 11 is connected to one end of the power supply capacitor C0 and the power supply unit 3 via a terminal VCC, and another end of the power supply capacitor C0 is connected to the GND. A terminal OUT is connected to the power supply unit 3.

The divided voltage Vd at the voltage dividing point P1, which is divided by the resistors R1 and R2, is input into the output control unit 101. The output control unit 101 executes a brown-in/out detection process, a PWM control, and other processes. A generated PWM signal is output from the terminal OUT and is input into a switching element (a metal oxide semiconductor field effect transistor (MOSFET)) in the power supply unit 3.

Here, the resistor R1 is a brown-in/out detection resistor for detecting brown-in/out. The brown-in/out detection resistor R1 is always connected to the terminal VH to which the input voltage Vin is applied, and therefore causes electric power loss.

Thus, the resistance of the resistor R1 is set at a high value, such as 120 MΩ for example, to reduce electric power loss in that part. Note that the resistor R2 connected to the GND side is set at 1 MΩ, for example.

Also, the brown-in/out detection resistor R1 is located at the vicinity of the starter switch 11a in the starter circuit 11 for the purpose of space saving of the chip size of the control IC 100 (detail of operation of the starter switch 11a is described later).

Figure 3:
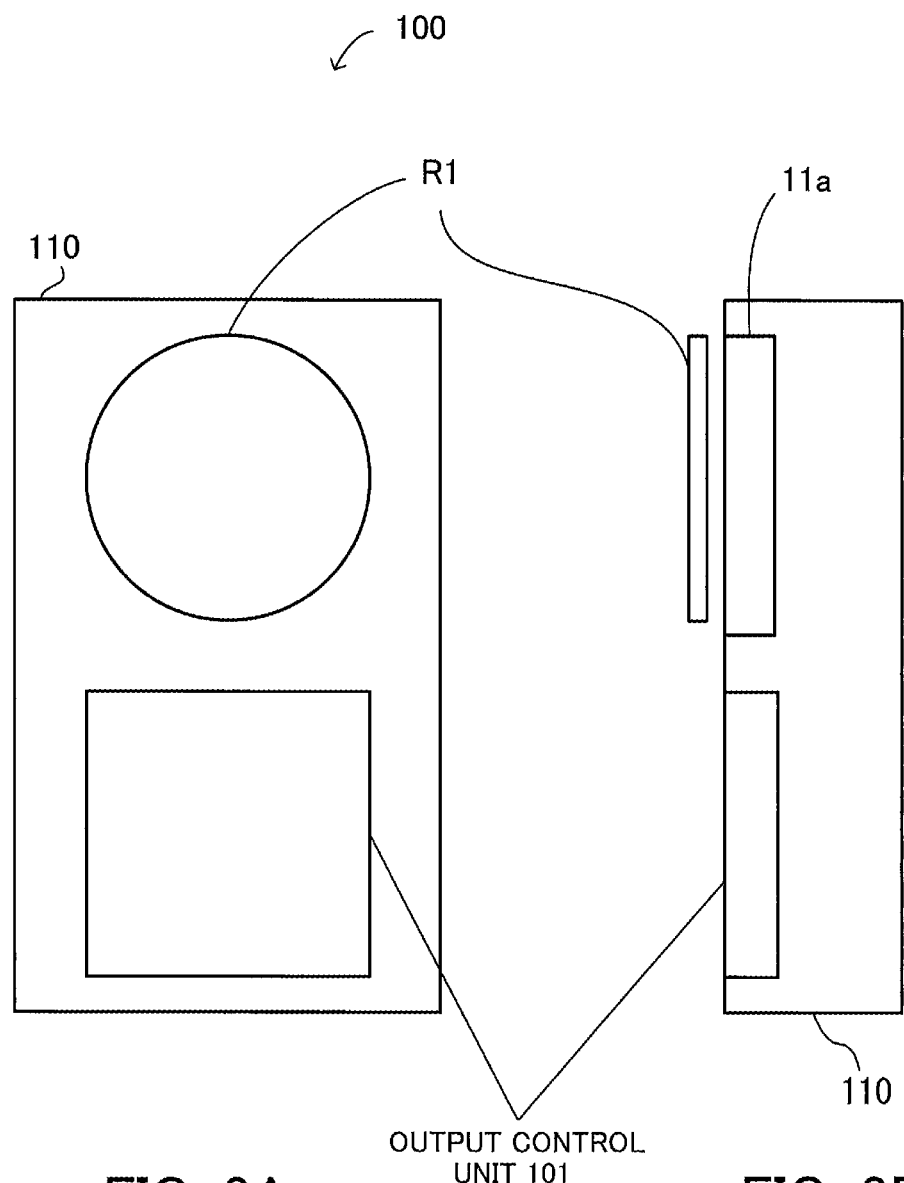
FIGS. 3A and 3B illustrate an implementation layout of a control IC.

FIGS. 3A and 3B illustrate front and side views, respectively, of an implementation layout of the control IC. A position relationship between the brown-in/out detection resistor R1 and the starter switch 11a is illustrated. The starter switch 11a is provided on a substrate 110 of the control IC 100, and the brown-in/out detection resistor R1, which is a resistor body formed in a coil shape wound around a circular region, is provided over the starter switch 11a.

As described above, the brown-in/out detection resistor R1 and the starter switch 11a in the starter circuit 11 are located at positions adjacent to each other. This layout of the control IC 100 causes capacitive coupling between the brown-in/out detection resistor R1 and the starter switch 11a, and thereby creates a stray capacitance (parasitic capacitance) Cf illustrated in FIG. 2. Thus, the divided voltage Vd at the voltage dividing point P1 between the brown-in/out detection resistor R1 and the resistor R2 is likely to fluctuate because of the influence of the stray capacitance Cf.

In particular, if an overshoot occurs in the divided voltage Vd when the input voltage Vin is applied, it is concerned that a voltage that is not regarded as brown-in in a normal situation is erroneously detected as a brown-in voltage, due to the voltage value of the overshoot.

Figure 4:
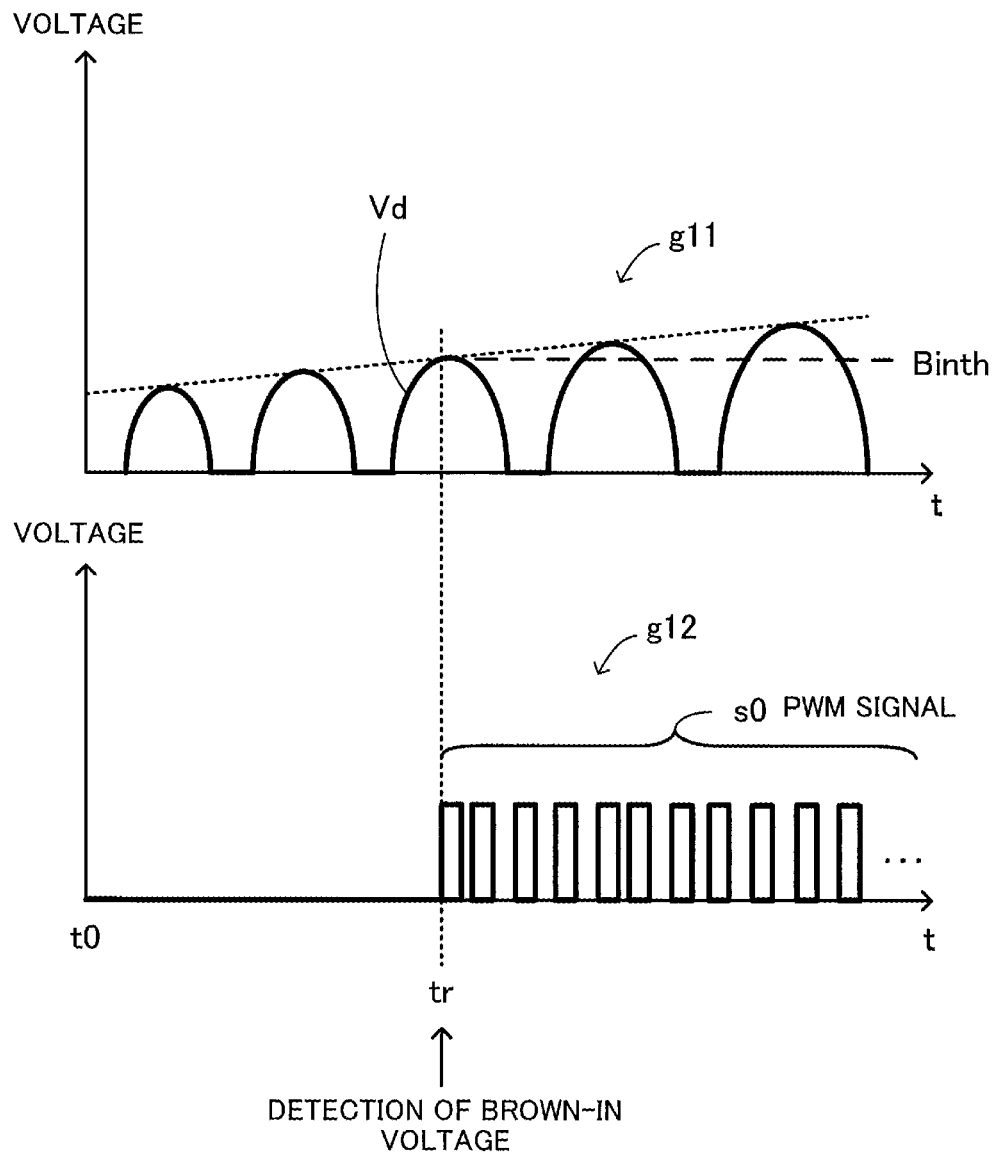
FIG. 4 illustrates operation when a brown-in voltage is normally detected.

Next, operation when a brown-in voltage is normally detected will be described. FIG. 4 illustrates operation when a brown-in voltage is normally detected. The vertical axis represents voltage, and the horizontal axis represents time t. The waveform g11 represents change of the divided voltage Vd at the voltage dividing point P1, which is generated by dividing the input voltage Vin applied to the terminal VH by means of the resistors R1 and R2. The waveform g12 represents a PWM signal s0 output from the terminal OUT of the control IC 100.

During the interval [t0≤t<tr] the divided voltage Vd is lower than the brown-in detection threshold value Binth. In this case, the PWM signal s0 is not output from the terminal OUT (L level output).

During the interval [tr≤t] the divided voltage Vd becomes equal to or higher than the brown-in detection threshold value Binth. In this case, the PWM signal s0 is output from the terminal OUT and is supplied to the switching element of the power supply unit 3. The PWM signal s0 serves as a gate signal of the switching element (power MOSFET) to control switching on the basis of the pulse width of the PWM signal s0.

Figure 5:
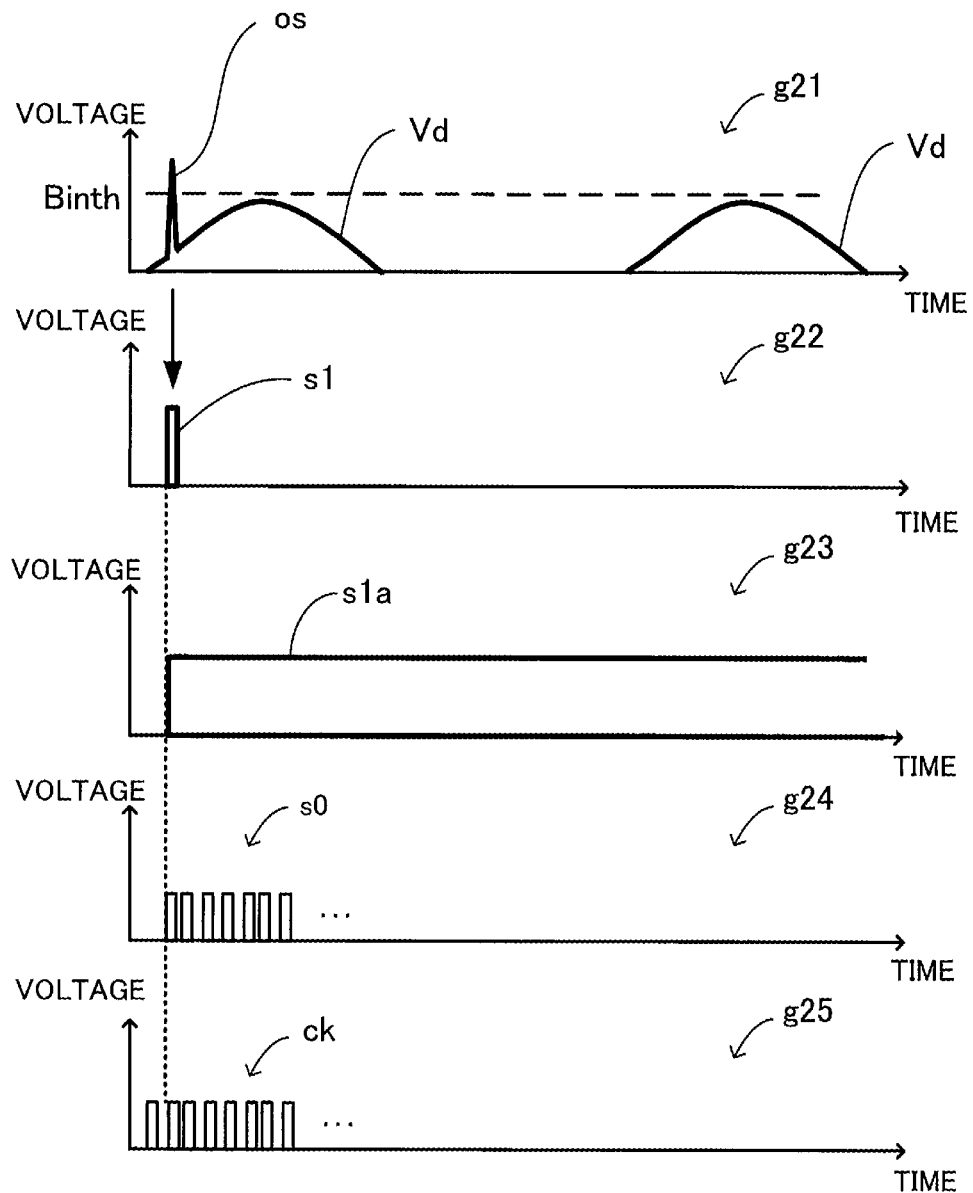
FIG. 5 illustrates waveforms when erroneous brown-in operation occurs.

Next, a case in which brown-in voltage is erroneously detected to cause erroneous brown-in operation will be described. FIG. 5 illustrates waveforms when erroneous brown-in operation occurs. The vertical axis represents voltage, and the horizontal axis represents time.

A waveform g21 represents a divided voltage Vd, and a waveform g22 represents a detection signal s1. A waveform g23 represents a latch signal s1a which is an output latching the detection signal s1.

A waveform g24 represents a PWM signal s0 output from the terminal OUT of the control IC 100. A waveform g25 represents a clock signal ck which is an internal clock in the control IC 100.

Here, when the divided voltage Vd becomes equal to or higher than the brown-in detection threshold value Binth, the detection signal s1 is output. Also, when the divided voltage Vd is lower than the brown-in detection threshold value Binth, the detection signal s1 is not output.

However, as described above, the divided voltage Vd fluctuates because of the influence of the stray capacitance Cf formed between the resistor R1 and the starter switch 11a, and an overshoot os occurs in FIG. 5.

This overshoot os exceeds the brown-in detection threshold value Binth and is erroneously detected to have reached the brown-in voltage. In this case, the output detection signal s1 is latched, and the latch signal s1a of H level is output.

The latch signal s1a enables PWM output, and therefore the PWM signal s0 based on the clock signal ck is output from the terminal OUT as illustrated in the waveform g24. Note that, in the example of FIG. 5, the duty ratios of the clock signal ck and the PWM signal s0 are both 50%.

As described above, in a normal situation, the divided voltage Vd becomes lower than the brown-in detection threshold value Binth so as not to perform brown-in, but the overshoot os generated in the divided voltage Vd becomes higher than the brown-in detection threshold value Binth in some cases. In such cases, a pulse of the detection signal s1 rises (changes from L level to H level), and in the past this pulse is determined to have reached the brown-in voltage, causing erroneous brown-in operation. That is, erroneous brown-in operation occurs and supplies a PWM signal to the switching element of the power supply unit 3, before the divided voltage Vd reaches a sufficient voltage.

Note that a high resistance, such as 120 MΩ, needs to be used as the brown-in/out detection resistor R1 for the purpose of reducing electric power loss of the control IC 100, and thus such erroneous operation has been more likely to occur.

The present technology is made in consideration of this point, and provides a control device for controlling a switching power supply, which prevents erroneous brown-in operation unfailingly even when a stray capacitance is generated between a brown-in/out detection resistor and a peripheral circuit and a brown-in detection voltage fluctuates.

Next, a configuration and operation of the control device for controlling the switching power supply, which is the technology of the present disclosure, will be described. An overview of an overall configuration of the switching power supply will be described at the beginning.

Figure 6:
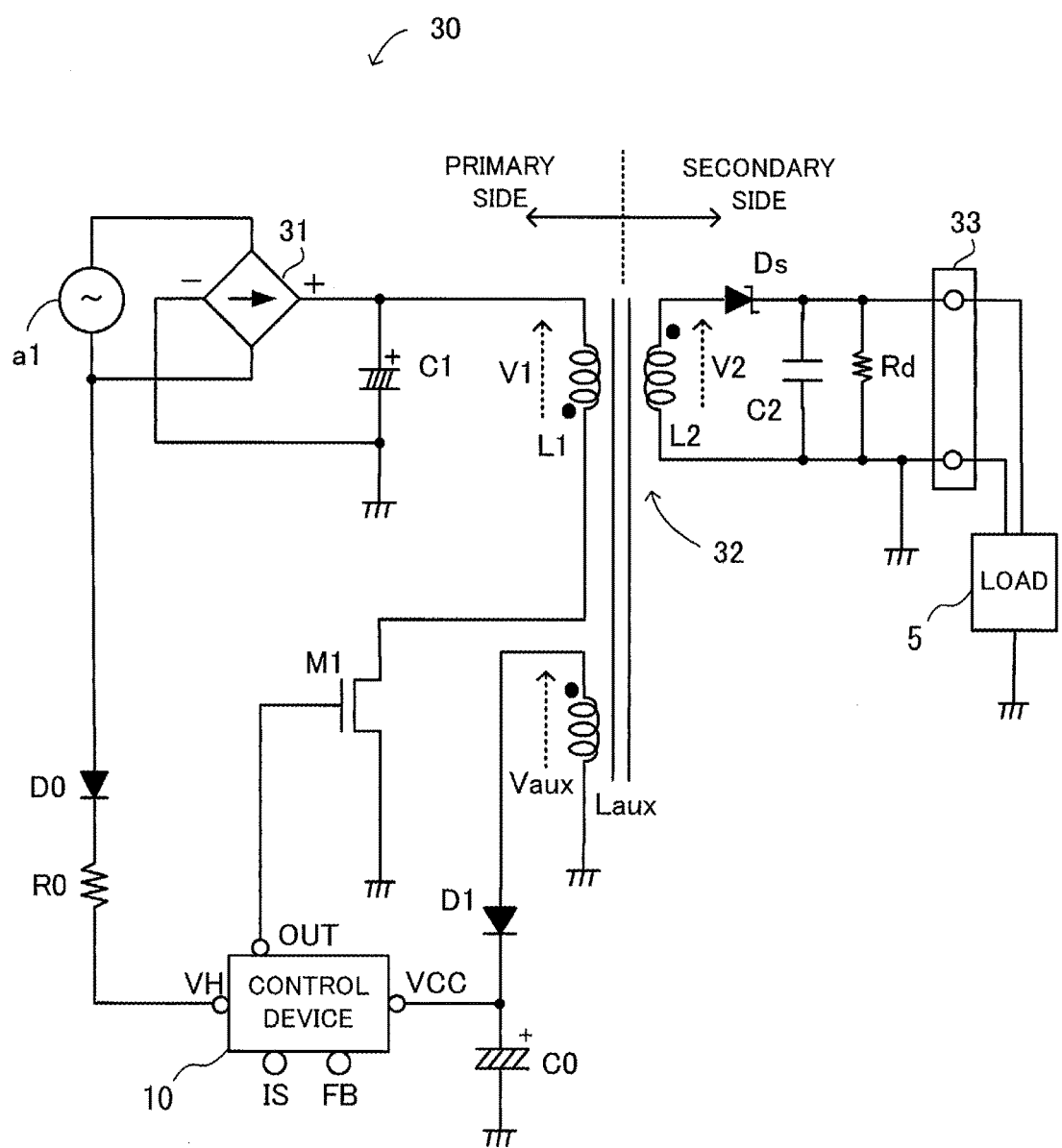
FIG. 6 illustrates an example of a configuration of a switching power supply.

FIG. 6 illustrates an example of a configuration of the switching power supply. For example, a switching power supply 30 is a flyback power supply and includes a bridge circuit 31, capacitors C0 to C2, resistors R0 and Rd, diodes D0, D1, and Ds, a transformer 32, a switching element M1, a direct current (DC) voltage output terminal 33, and a control device 10.

An N channel metal oxide semiconductor field effect transistor (NMOS) is used as the switching element M1, for example. Also, the transformer 32 includes a primary winding L1 and a secondary winding L2 and further includes an auxiliary winding Laux. Note that the control device 10 provides the function of the control device 1 of FIG. 1A.

With regard to connection relationship between circuit elements, one input terminal of the bridge circuit 31 is connected to an AC voltage supply a1, and another input terminal is connected to the AC voltage supply a1 and an anode of the diode D0.

A positive-side output terminal of the bridge circuit 31 is connected to one end of the capacitor C1 and one end of the primary winding L1 of the transformer 32. A negative-side output terminal of the bridge circuit 31 is connected to another end of the capacitor C1 and a GND. A cathode of the diode D0 is connected to one end of the resistor R0, and another end of the resistor R0 is connected to a terminal VH of the control device 10.

A drain of the NMOS transistor M1 is connected to another end of the primary winding L1, and a gate of the NMOS transistor M1 is connected to a terminal OUT of the control device 10, and a source of the NMOS transistor M1 is connected to the GND.

One end of the auxiliary winding Laux is connected to an anode of the diode D1, and another end of the auxiliary winding Laux is connected to the GND. A cathode of the diode D1 is connected to the terminal VCC of the control device 10 and one end of the power supply capacitor C0, and another end of the power supply capacitor C0 is connected to the GND.

One end of the secondary winding L2 is connected to an anode of the diode Ds, and a cathode of the diode Ds is connected to one end of the capacitor C2, one end of the resistor Rd, and one terminal of the DC voltage output terminal 33.

Another end of the secondary winding L2 is connected to another end of the capacitor C2, another end of the resistor Rd, another terminal of the DC voltage output terminal 33, and the GND. Note that a grounded load 5 is connected to the two terminals of the DC voltage output terminal 33.

Here, the bridge circuit 31 rectifies the AC voltage input from the AC voltage supply a1. The capacitor C1 smoothes the rectified voltage to convert the rectified voltage to a direct-current voltage, thereby generating a voltage V1 in the primary winding L1.

The diode Ds located at the secondary side rectifies a voltage V2 generated in the secondary winding L2. The capacitor C2 smoothes the rectified voltage, and the voltage after smoothing is supplied to the load 5. The limitation resistor Rd limits the electrical current that flows in the load 5.

Also, the voltage V1 generated in the primary winding L1 and the voltage V2 generated in the secondary winding L2 have opposite polarities, and the voltage Vaux generated in the auxiliary winding Laux and the voltage V2 generated in the secondary winding L2 have the same polarity.

Here, the switching power supply 30 includes the auxiliary winding Laux that is wound in the same direction as the secondary winding L2 and grounded on the GND of the primary side, and the voltage between both ends (or its divided voltage) of the auxiliary winding Laux is sent to the terminal VCC of the control device 10 in a steady state.

The control device 10 generates a PWM signal on the basis of electrical current information for driving the NMOS transistor M1 which is input into a terminal IS and secondary-side output voltage information which is input into a terminal FB, and outputs the PWM signal from the terminal OUT.

The PWM signal is input into the gate of the NMOS transistor M1 as a gate signal, and the NMOS transistor M1 is turned on and off on the basis of the PWM signal. With this operation, PWM control is performed to set an output voltage at a target level.

Figure 7:
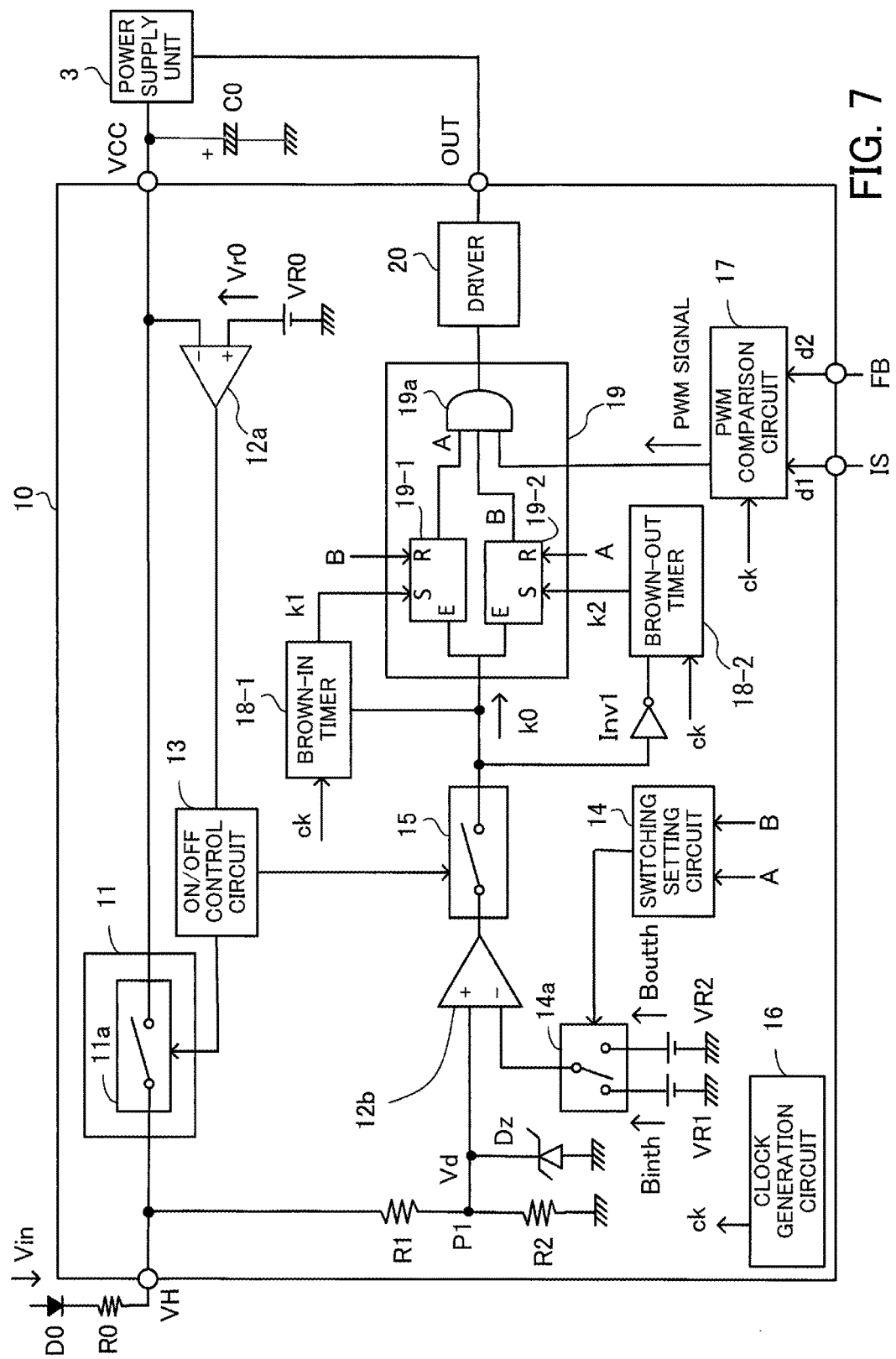
FIG. 7 illustrates an example of a configuration of a control device for controlling a switching power supply.

Next, a configuration of the control device 10 will be described. FIG. 7 illustrates an example of a configuration of the control device for controlling the switching power supply. The control device 10 controls switching of the power supply unit 3.

Note that the part configuring the switching power supply 30 illustrated in FIG. 6 except the control device 10, the diode D0, the resistor R0, and the power supply capacitor C0 corresponds to the power supply unit 3.

The control device 10 includes resistors R1 and R2, a diode (zener diode) Dz, reference voltage supplies VR0, VR1, and VR2, a starter circuit 11, a power supply voltage detection comparator 12a, a brown-in/out detection comparator 12b, an on/off control circuit 13, a switching setting circuit 14, a threshold value switching switch 14a, a switch circuit 15, a clock generation circuit 16, a PWM comparison circuit 17, a brown-in timer 18-1, a brown-out timer 18-2, a drive control circuit 19, and a driver 20. The drive control circuit 19 includes latch circuits 19-1 and 19-2, and a logical element 19a.

Also, the control device 10 includes a terminal VH, a terminal OUT, a terminal IS, a terminal PB, and a terminal VCC. Surrounding components connected outside the terminal VH, the terminal VCC, and the terminal OUT are the same as FIG. 2, and thus their description will not be repeated.

Here, the brown-in/out detection comparator 12b provides the function of the detection circuit 1b of FIG. 1A, and the brown-in timer 18-1 provides the function of the brown-in timer 1c of FIG. 1A. Also, the latch circuit 19-1 provides the function of the latch circuit 1d of FIG. 1A, and the logical element 19a provides the function of the logical element 1e of FIG. 1A.

Their operation will be described. In the steady state, the control device 10 operates by receiving electric power output from the power supply unit 3 at the terminal VCC.

Note that, when the control device 10 starts operating, the power supply unit 3 has not started operating yet. Hence, the control device 10 utilizes the electric power input from the terminal VH, when starting its operation.

In this case, electric power for driving the control device 10 is once accumulated in the external power supply capacitor C0 and is supplied to the control device 10 via the terminal VCC from the power supply capacitor C0. As described above, the starter circuit 11 controls whether to receive the operation electric power from the terminal VH side or from the power supply unit 3 side, depending on an operation start state and a steady state.

The power supply voltage detection comparator 12a compares a charged voltage of the power supply capacitor C0 with a power supply voltage detection threshold value Vr0 output from the reference voltage supply VR0. In this case, when the charged voltage of the power supply capacitor C0 is lower than the power supply voltage detection threshold value Vr0 (when the power supply unit 3 is not in a normal operation state), the power supply voltage detection comparator 12a outputs H level (a first signal).

Also, when the charged voltage of the power supply capacitor C0 is higher than the power supply voltage detection threshold value Vr0 (when the power supply unit 3 is in a normal operation state), the power supply voltage detection comparator 12a outputs L level (a second signal).

The on/off control circuit 13 outputs H level when the output of the power supply voltage detection comparator 12a is H level, and outputs L level when the output of the power supply voltage detection comparator 12a is L level.

When receiving H level from the on/off control circuit 13, the starter circuit 11 turns on the starter switch 11a in the starter circuit 11 in order to flow electrical current from the terminal VH to the power supply capacitor C0.

Also, when receiving L level from the on/off control circuit 13, the starter circuit 11 turns off the starter switch 11a. In this case, the power supply unit 3 is in a normal operation state, and the control device 10 receives electric power from the power supply unit 3.

On the other hand, the input voltage Vin input through the terminal VH is divided by means of the resistors R1 and R2, and the divided voltage Vd is generated at the voltage dividing point P1.

Note that a diode Dz is connected to a line that connects between the voltage dividing point P1 and a positive input terminal of the brown-in/out detection comparator 12b. This diode absorbs a surge voltage, such as overshoot, and clamps an overvoltage which may occur at the voltage dividing point P1 by using pressure resistance of the diode Dz, thereby preventing destruction of elements by the overvoltage.

On the other hand, one end of the resistor R1 is connected to the terminal VH and an input terminal of the starter circuit 11, and another end of the resistor R1 is connected to one end of the resistor R2, a cathode of the diode Dz, and the positive input terminal of the brown-in/out detection comparator 12b, and another end of the resistor R2 and an anode of the diode Dz are connected to the GND.

With regard to the brown-in/out detection comparator 12b, the divided voltage Vd is input into the positive input terminal, and the output signal from the threshold value switching switch 14a is input into a negative input terminal of the brown-in/out detection comparator 12b. The threshold value switching switch 14a switches between the input from the reference voltage supply VR1 and the input from the reference voltage supply VR2, on the basis of a switch switching signal output from the switching setting circuit 14.

The reference voltage supply VR1 outputs a brown-in detection threshold value Binth. For example, the brown-in detection threshold value Binth is 0.9 V (the corresponding AC effective voltage is 90 V).

Also, the reference voltage supply VR2 outputs a brown-out detection threshold value Boutth. For example, the brown-out detection threshold value Boutth is 0.7 V (the corresponding AC effective voltage is 70V).

The switching setting circuit 14 outputs a switch switching signal for selecting the brown-in detection threshold value Binth when a signal A is input, and outputs a switch switching signal for selecting the brown-out detection threshold value Boutth when a signal B is input (in other words, operates like a toggle switch). Note that when the control device 10 operates initially, the switching setting circuit 14 outputs a switch switching signal for selecting the brown-in detection threshold value Binth. In other words, when the control device 10 begins operation, the detection threshold value for detecting voltage anomalies is set as Binth to correspond to a brown-in threshold value. However, after the control device 10 begins operating, the threshold value for detecting voltage anomalies may be selected to be one of Binth or Boutth, based on an operating voltage level of the power supply unit 3, such as a low voltage operating level or a high voltage operating level of the power supply unit 3.

When the level of the divided voltage Vd is equal to or higher than the threshold value voltage input into the negative input terminal, the brown-in/out detection comparator 12b outputs a signal of H level. Also, when the level of the divided voltage Vd is lower than the threshold value voltage, the brown-in/out detection comparator 12b outputs a signal of L level.

Hence, when the control device 10 operates initially, the divided voltage Vd at the voltage dividing point P1 gradually rises, and if the divided voltage Vd becomes higher than the brown-in detection threshold value Binth, the brown-in/out detection comparator 12b outputs H level.

The switch circuit 15 turns into an ON state, when the power supply unit 3 starts operating and the power supply capacitor C0 is charged sufficiently. That is, when receiving an output of L level (second signal) from the on/off control circuit 13 (off state of the starter switch 11a), the switch circuit 15 is switched on to send the signal output from the brown-in/out detection comparator 12b to a circuit of next stage.

Also, when receiving an output of H level (first signal) from the on/off control circuit 13 (on state of the starter switch 11a), the switch circuit 15 is switched off to prevent the signal output from the brown-in/out detection comparator 12b from being sent to the circuit of next stage.

Note that when the signal output from the on/off control circuit 13 is H level, the starter switch 11a is turned on, and the electric power applied to the terminal VH is used to charge the power supply capacitor C0. In this case, the voltage applied to the terminal VH becomes lower than the voltage that is to be detected in a normal situation, and therefore the brown-in state is not detected accurately. Thus, in this state, the switch of the switch circuit 15 is turned off, so as not to detect the brown-in/out state.

The clock generation circuit 16 generates a clock signal ck used in the control device 10. The clock signal ck is input into the PWM comparison circuit 17, the brown-in timer 18-1, and the brown-out timer 18-2, for example. For example, the frequency of the clock signal ck is 100 kHz or 65 kHz.

The PWM comparison circuit 17 generates a PWM signal for driving the switching element M1 in the power supply unit 3, on the basis of the clock signal ck, a signal d1 input from the terminal IS, and a signal d2 input from the terminal PB. The signal d1 is electrical current information for driving the switching element M1, and the signal d2 is output voltage information of the power supply unit 3.

Note that the basic frequency of PWM output is the frequency of the clock signal ck. Then, the pulse width of the PWM signal output from the terminal OUT is adjusted on the basis of the clock cycle and the signals d1 and d2. Thereby, the output voltage of the power supply unit 3 is controlled at a constant level.

On the other hand, the brown-in timer 18-1 starts counting operation, triggered by an output signal k0 from the switch circuit 15, after the operation of the control device 10 is started. When starting the counting operation, the brown-in timer 18-1 outputs a pulse signal k1 after a set first predetermined time elapses. Specifically, the pulse signal k1 is a timing signal for receiving the output signal k0 anew after the first predetermined time elapses from the time point at which the output signal k0 is generated.

The brown-out timer 18-2 starts the counting operation, triggered by a signal generated by inverting the output signal k0 from the switch circuit 15 by means of an inverter Inv1. When starting the counting operation, the brown-out timer 18-2 outputs a pulse signal k2 after the set second predetermined time elapses. Specifically, the pulse signal k2 is a timing signal for receiving the output signal k0 after a second predetermined time elapses from the time point at which the output signal k0 is generated.

The drive control circuit 19 includes latch circuits 19-1 and 19-2 and an AND element 19a having 3 inputs and 1 output, and enable terminals (E) of the latch circuits 19-1 and 19-2 receive the output signal k0 from the switch circuit 15.

A set terminal (S) of the latch circuit 19-1 receives the pulse signal k1 which is the output of the brown-in timer 18-1, and a reset terminal (R) of the latch circuit 19-1 receives the signal B. Also, the output of the latch circuit 19-1 is the signal A.

A set terminal (S) of the latch circuit 19-2 receives the pulse signal k2 which is the output of the brown-out timer 18-2, and a reset terminal (R) of the latch circuit 19-2 receives the signal A. Also, the output of the latch circuit 19-2 is the signal B.

When the pulse signal k1 is output from the brown-in timer 18-1, the latch circuit 19-1 latches the output signal k0 from the switch circuit 15 and outputs the signal A. In this case, the signal A is input into the reset terminal (R) of the latch circuit 19-2, and therefore the latch circuit 19-2 is reset.

Also, when the pulse signal k2 is output from the brown-out timer 18-2, the latch circuit 19-2 latches the output signal k0 from the switch circuit 15 and outputs the signal B. In this case, the signal B is input into the reset terminal (R) of the latch circuit 19-1, and therefore the latch circuit 19-1 is reset.

The AND element 19a receives the signals A and B and the PWM signal output from the PWM comparison circuit 17, and outputs a result of logical AND of these three inputs to the driver 20.

The driver 20 amplifies the output signal from the AND element 19a, and outputs a drive signal from the terminal OUT. Note that, in a steady state, the terminal OUT outputs pulses of the PWM signal for driving the gate of the switching element M1. Also, when the voltage input into the terminal VH does not reach a predetermined voltage (when becomes lower than the brown-in voltage), the output of the terminal OUT is in an L level state.

Figure 8:
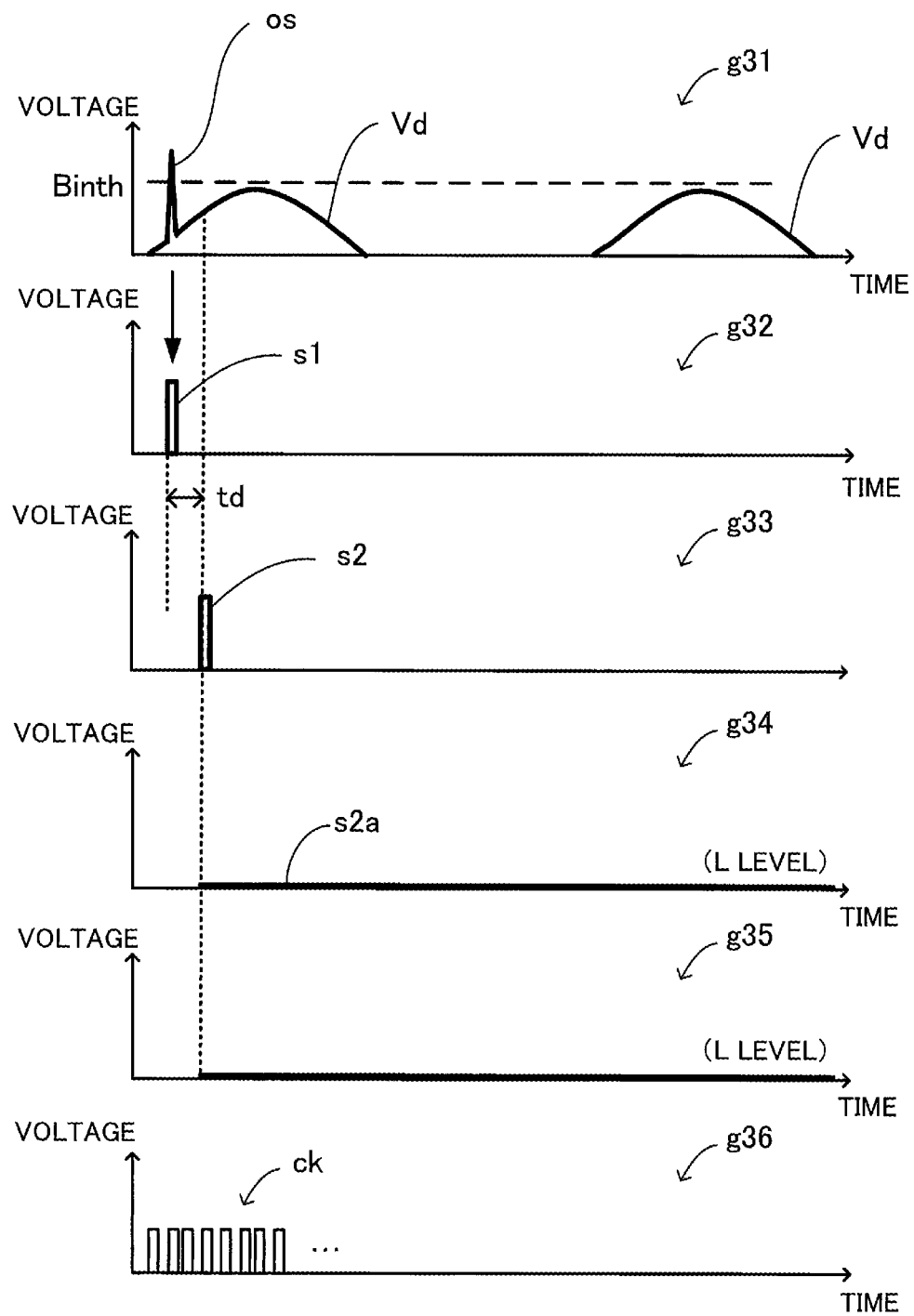
FIG. 8 illustrates operation waveforms of a control device that prevents erroneous brown-in operation.

Next, operation waveforms of the control device 10 that prevents erroneous brown-in operation will be described. FIG. 8 illustrates operation waveforms of the control device that prevents erroneous brown-in operation. The vertical axis represents voltage, and the horizontal axis represents time.

The waveform g31 represents a divided voltage Vd, and the waveform g32 represents a detection signal s1 (corresponding to the output signal k0 of FIG. 7). The waveform g33 represents a detection signal s2 (corresponding to the pulse signal k1 of FIG. 7) at which the first predetermined time elapses from the time point of the detection signal s1.

The waveform g34 represents a latch signal s2a which is an output latching the detection signal s2. That is, the latch signal s2a corresponds to the output signal of the latch circuit 19-1. The waveform g35 represents an output signal from the terminal OUT. The waveform g36 represents a clock signal ck.

Here, if an overshoot os occurring in the divided voltage Vd exceeds the brown-in detection threshold value Binth (the waveform g31), the brown-in/out detection comparator 12b detects the overshoot os and outputs the detection signal s1 (the waveform g32).

When the detection signal s1 is input into the brown-in timer 18-1, the detection signal s2 is output after a first predetermined time td elapses from that time point (the waveform g33). Then, the latch circuit 19-1 latches the signal output from the switch circuit 15, that is, the output of the brown-in/out detection comparator 12b, by using the detection signal s2 (the waveform g34).

That is, the latch circuit 19-1 latches the output of the brown-in/out detection comparator 12b after the first predetermined time td elapses from the detection signal s1, and this is equal to measuring a level of the divided voltage V1 by avoiding a voltage fluctuation period during which the overshoot os occurs.

The output of the brown-in/out detection comparator 12b is L level when the detection signal s2 is input into the latch circuit 19-1 because the generation period of the overshoot os is passed, and therefore the latch signal s2a of the latch circuit 19-1 is also L level.

In addition, as the latch signal s2a is L level, the output signal of the AND element 19a is also L level, and the output signal of the terminal OUT is also L level (the waveform g35).

As described above, the output of the brown-in/out detection comparator 12b is latched in response to the detection signal s2 after the first predetermined time td elapses from the detection signal s1, and the logical AND of the latch output and the PWM signal is obtained.

Thereby, even when the overshoot os that exceeds the brown-in detection threshold value Binth occurs, the PWM signal is prevented from being supplied to the switching element of the power supply unit 3, so as to prevent the erroneous brown-in operation from occurring.

Figure 9:
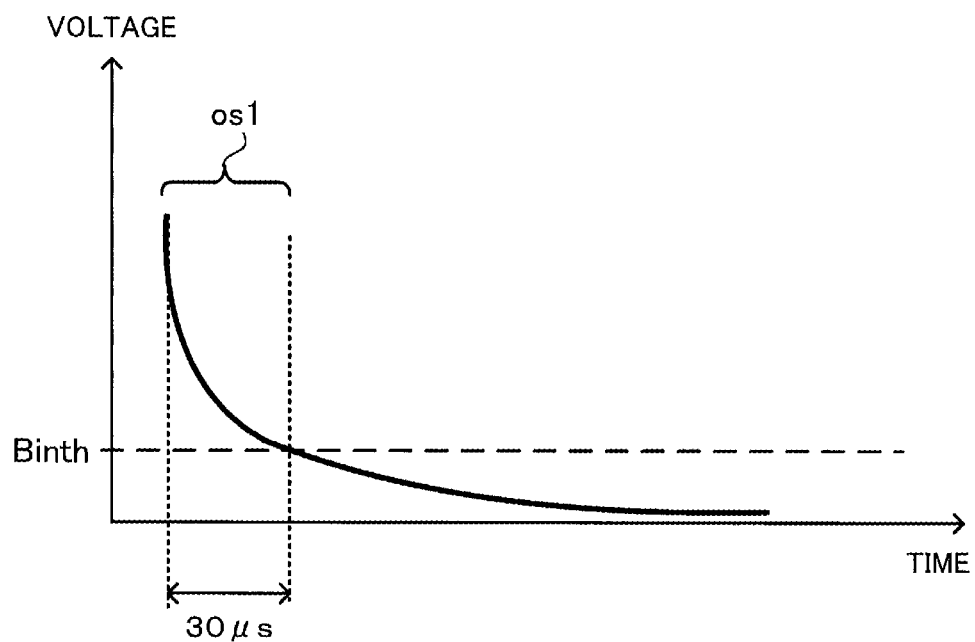
FIG. 9 illustrates an observed waveform of overshoot.

Next, an observed waveform of an overshoot that causes erroneous brown-in operation will be described. FIG. 9 illustrates an observed waveform of an overshoot. The vertical axis represents voltage, and the horizontal axis represents time.

Rising and falling of an overshoot, which occurs at the voltage dividing point P1 and causes erroneous operation, is observed when the power supply is turned on (when the terminal VH rises like a step). Note that the overshoot rises and thereafter falls because of the resistor R2.

The example of FIG. 9 illustrates a measurement result of an overshoot os1 that occurs in the voltage at the voltage dividing point P1, when 100V is applied on the terminal VH. The measured surging time of the overshoot os1 which exceeds the brown-in detection threshold value Binth is 30 µs.

Next, the first predetermined time set in the brown-in timer 18-1 will be described. The pulse shape of the overshoot illustrated in FIG. 9 is different, depending on models of the switching power supply.

Thus, in the present technology, the first predetermined time set in the brown-in timer 18-1 is set on the basis of the CR time constant calculated from the capacitance value of the stray capacitance Cf that is generated by the capacitive coupling between the starter switch 11a and the resistor R1 and the resistance value of the resistor R2 connected to the GND side of the voltage division resistance.

FIG. 10 illustrates first predetermined times set in the brown-in timer. A table T1 includes CR time constants (ms), surging times (µs), and first predetermined times (µs), for respective models.

A time equal to or longer than one-fifth, desirably one-seventh, of the "CR time constant" is set in the brown-in timer 18-1 as the "first predetermined time", in order to effectively avoid an voltage fluctuation period during which overshoots occur (the table T1 illustrates an example of being equal to or longer than one-seventh).

As described above, in the present technology, the first predetermined time is set in the brown-in timer 18-1 on the basis of the calculation result of the CR time constant calculated from the capacitance value of the stray capacitance Cf and the resistance value of the resistor R2. Thereby, electric power loss is reduced, and a normal voltage at the voltage dividing point P1 is detected without observing an overshoot that causes erroneous operation in each model, and a brown-in voltage is detected accurately.

In the above embodiment, the brown-in timer 18-1 starts counting operation, triggered by the output signal k0 from the switch circuit 15, and outputs the pulse signal k1 after a set first predetermined time elapses. However, the present technology is not limited thereto, but the brown-in timer 18-1 may output the output signal k0 from the switch circuit 15 as the pulse signal k1, by delaying the output signal k0 by the first predetermined time. This delay may be performed by a delay circuit. The present technology also includes such a configuration and achieves the same effect as the above case.

While embodiments have been described in detail with respect to detection of a brown-in voltage, and reducing and eliminating false detections of a brown-in voltage, embodiments are not limited to a brown-in voltage. For example, embodiments of the invention apply equally to a brown-out voltage. In other words, embodiments of the invention are directed to reducing and eliminating false detections of a voltage anomaly, such as a brown-in voltage or a brown-out voltage.

In one embodiment, a control device for controlling a switching power supply includes a detection circuit configured to compare an input voltage with a voltage anomaly detection threshold value. The detection circuit outputs a first detection signal of a first electric potential level during a period in which the input voltage is equal to or exceeds the voltage anomaly detection threshold value, and the detection circuit outputs the first detection signal of a second electric potential level different from the first electric potential during a period in which the input voltage is lower than the voltage anomaly detection threshold value. The control device includes a voltage anomaly timer configured to output a second detection signal after a first predetermined time elapses after reception of the first detection signal. The control device further includes a latch circuit configured to latch an output from the detection circuit in response to the second detection signal. The control device further includes a logic circuit configured to perform a logical AND operation of an output of the latch circuit and a pulse width modulation signal.

In the above-described embodiment, the latch circuit may be configured to latch the first detection signal from the detection circuit in response to the second detection signal.

In one embodiment, the detection circuit includes a switching circuit configured to provide, alternatively, each of a first threshold value and a second threshold value as the voltage anomaly detection threshold value. In other words, the switching circuit is switched to output either the first threshold value or the second threshold value depending on an input provided to the switching circuit. In one embodiment, the input provided to the switching circuit to control the output of the switching circuit (i.e. whether to output the first threshold value or the second threshold value) is based on a voltage level of the switching power supply corresponding to whether the switching power supply is operating at a low voltage state or a high voltage state.

Although embodiments have been described in which high (H) or low (L) voltages are generated, these are provided by way of example, and it is understood that circuits may be designed with components that may be activated to perform an action either based on a high voltage level or a low voltage level. Accordingly, embodiments of the invention encompass circuits configured to perform the above-described features in response to different activation levels.

Although the embodiments are illustrated in the above, the configuration of each unit illustrated in the embodiments can be replaced by another unit having the same function. Also, optional configurations and processes may be added.

A brown-in voltage can be detected highly accurately to prevent erroneous brown-in operation.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A control device for controlling a switching power supply, comprising:
a voltage dividing circuit configured to generate a divided voltage by dividing an input voltage, the voltage dividing circuit including a first resistor which is supplied with the input voltage at a first end and a second resistor having a first end connected to a second end of the first resistor;
a detection circuit configured to compare the divided voltage with a brown-in detection threshold value to determine whether the divided voltage reaches a brown-in voltage, and output a first detection signal of a first electric potential level during a period in which the divided voltage is equal to or higher than the brown-in detection threshold value, and output the first detection signal of a second electric potential level during a period in which the divided voltage is lower than the brown-in detection threshold value;
a brown-in timer configured to output a second detection signal after a first predetermined time elapses after reception of the first detection signal;
a latch circuit configured to latch an output from the detection circuit in response to the second detection signal; and
a logical element configured to perform a logical AND operation of an output of the latch circuit and a pulse width modulation signal for controlling a switching element of the switching power supply.

2. The control device for controlling the switching power supply according to claim 1, further comprising:
an input voltage terminal which is supplied with the input voltage;
a power supply voltage terminal connected to one end of an external power supply capacitor, wherein in a steady state the power supply voltage terminal is supplied with a power supply voltage from the switching power supply;
a starter switch configured to turn on and off a connection between the input voltage terminal and the power supply voltage terminal;
a power supply voltage detection comparator configured to compare a charged voltage charged in the power supply capacitor with a threshold value; and
a switch circuit configured to turn on and off a connection between an output terminal of the detection circuit and input terminals of the brown-in timer and the latch circuit.

3. The control device for controlling the switching power supply according to claim 2, wherein
the power supply voltage detection comparator outputs a first signal when the charged voltage is lower than the threshold value, and outputs a second signal when the charged voltage is equal to or higher than the threshold value,
the starter switch turns on the connection between the input voltage terminal and the power supply voltage terminal upon receiving the first signal, to charge the power supply capacitor with the input voltage, so that the control device starts operating with the charged voltage, and turns off the connection between the input voltage terminal and the power supply voltage terminal upon receiving the second signal, to operate the control device with the power supply voltage supplied from the switching power supply, and
the switch circuit turns off the connection between the output terminal of the detection circuit and the input terminals of the brown-in timer and the latch circuit upon receiving the first signal, and turns on the connection between the output terminal of the detection circuit and the input terminals of the brown-in timer and the latch circuit upon receiving the second signal.

4. The control device for controlling the switching power supply according to claim 2, wherein
in the brown-in timer, the first predetermined time is set on the basis of a CR time constant calculated from a capacitance value of a stray capacitance that is generated by capacitive coupling between the starter switch and the first resistor and a resistance value of the second resistor.

5. A control device for controlling a switching power supply, comprising:

a detection circuit configured to compare first voltage with a voltage anomaly detection threshold value, to output a first detection signal of a first electric potential level during a period in which the first voltage is equal to or exceeds the voltage anomaly detection threshold value, and to output the first detection signal of a second electric potential level different from the first electric potential during a period in which the first voltage is lower than the voltage anomaly detection threshold value;

a voltage anomaly timer configured to output a second detection signal after a first predetermined time elapses after reception of the first detection signal;

a latch circuit configured to latch an output from the detection circuit in response to the second detection signal; and a logic circuit configured to perform a logical AND operation of an output of the latch circuit and a pulse width modulation signal.

6. The control device of claim 5, wherein the latch circuit is configured to latch the first detection signal from the detection circuit in response to the second detection signal.

7. The control device of claim 5, wherein the detection circuit includes a switching circuit configured to provide, alternatively, each of a first threshold value and a second threshold value as the voltage anomaly detection threshold value, wherein the first threshold value corresponds to a brown-in threshold value, and the second threshold value corresponds to a brown-out threshold value.

8. The control device of claim 7, wherein the switching circuit is configured to select from among the first threshold value and the second threshold value to be the voltage anomaly threshold value based on whether a voltage level from the switching power supply corresponds to a low voltage output or a high voltage output.

9. The control device of claim 7, wherein the latch circuit further comprises:

a first latch configured to receive as a first input the output from the detection circuit, and to output a first latch output signal;

a second latch configured to receive as a first input the output from the detection circuit, and to output a second latch output signal;

wherein the first latch is configured to receive the second latch output signal at a "reset" terminal, and the second latch is configured to receive the first latch output signal at a "reset" terminal.

10. The control device of claim 9, wherein the logic circuit is configured to perform the logical AND operation of the first latch output signal, the second latch output signal, and the pulse width modulation signal.

11. The control device of claim 5, further comprising a voltage divider circuit including first and second resistors connected in series, the voltage divider circuit configured to receive an input voltage, to divide the input voltage with the first and second resistors, and to output the first voltage.

12. The control device of claim 5, further comprising:

an input voltage terminal configured to receive an input voltage and provide the input voltage to the control device;

a power supply voltage terminal connected to one end of a power supply capacitor;

a starter switch configured to turn close and open a connection between the input voltage terminal and the power supply voltage terminal;

a power supply voltage detection comparator configured to compare a charged voltage charged in the power supply capacitor with a threshold value; and a switch circuit configured to close and open a connection between an output terminal of the detection circuit and input terminals of the brown-in timer and the latch circuit.

13. The control device of claim 12, wherein the power supply voltage detection comparator is configured to output a first signal when the charged voltage is lower than the threshold value, and outputs a second signal when the charged voltage is equal to or higher than the threshold value, the starter switch is configured to close the connection between the input voltage terminal and the power supply voltage terminal upon receiving the first signal, and to open the connection between the input voltage terminal and the power supply voltage terminal upon receiving the second signal, to operate the control device with the power supply voltage supplied from the switching power supply, and the switch circuit is configured to open the connection between the output terminal of the detection circuit and the input terminals of the brown-in timer and the latch circuit upon receiving the first signal, and to close the connection between the output terminal of the detection circuit and the input terminals of the brown-in timer and the latch circuit upon receiving the second signal.

14. The control device of claim 12, wherein the first predetermined time is based on a CR time constant calculated from a capacitance value of a stray capacitance that is generated by capacitive coupling between the starter switch and the first resistor and a resistance value of the second resistor.

* * * * *